(12) United States Patent
Jost et al.

(10) Patent No.: US 10,405,099 B2
(45) Date of Patent: Sep. 3, 2019

(54) MEMS DEVICE AND METHOD FOR PRODUCING A MEMS DEVICE

(71) Applicant: Infineon Technologies Austria AG, Villach (AT)

(72) Inventors: Stefan Jost, Munich (DE); Wolfgang Friza, Villach (AT); Stefan Geissler, Regensburg (DE); Soenke Pirk, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 7 days.

(21) Appl. No.: 15/826,788

(22) Filed: Nov. 30, 2017

(65) Prior Publication Data

US 2018/0152793 A1    May 31, 2018

(30) Foreign Application Priority Data

Nov. 30, 2016   (DE) .................. 10 2016 123 130

(51) Int. Cl.

| | |
|---|---|
| *H04R 19/04* | (2006.01) |
| *H04R 9/08* | (2006.01) |
| *H04R 19/02* | (2006.01) |
| *B81B 7/00* | (2006.01) |
| *B81C 1/00* | (2006.01) |
| *H04R 31/00* | (2006.01) |
| *H04R 19/00* | (2006.01) |

(52) U.S. Cl.
CPC ............. *H04R 9/08* (2013.01); *B81B 7/0006* (2013.01); *B81C 1/00166* (2013.01); *H04R 19/005* (2013.01); *H04R 19/02* (2013.01); *H04R 19/04* (2013.01); *H04R 31/00* (2013.01); *B81B 2201/0257* (2013.01); *B81B 2203/0127* (2013.01); *B81B 2203/04* (2013.01); *H04R 31/003* (2013.01); *H04R 2201/003* (2013.01)

(58) Field of Classification Search
CPC .... H04R 19/005; H04R 19/016; H04R 19/02; H04R 19/04; H04R 23/006; H04R 31/003; H04R 2201/003; B81B 2201/0257
USPC ........ 381/113, 173, 174, 191, 369; 257/416; 438/53
See application file for complete search history.

(56) References Cited

U.S. PATENT DOCUMENTS

| 5,596,222 A | 1/1997 | Bernstein |
|---|---|---|
| 8,415,717 B2 * | 4/2013 | Lee ..................... H04R 19/005 257/254 |
| 2003/0179535 A1 | 9/2003 | Shimanouchi et al. |
| 2012/0225259 A1 | 9/2012 | Mortensen et al. |

(Continued)

FOREIGN PATENT DOCUMENTS

| DE | 10310342 A1 | 11/2003 |
|---|---|---|
| DE | 102015122781 A1 | 6/2016 |

(Continued)

*Primary Examiner* — Huyen D Le (74) *Attorney, Agent, or Firm* — Viering, Jentschura & Partner MBB (57) ABSTRACT

A MEMS device is provided. The MEMS device includes a membrane, and at least one electrode arranged at a distance from the membrane. The at least one electrode includes a layer stack. The layer stack includes a first insulation layer, a first conductive layer arranged thereabove, a second insulation layer arranged thereabove, a second conductive layer arranged thereabove, and a third insulation layer arranged thereabove.

21 Claims, 5 Drawing Sheets

(56) References Cited

U.S. PATENT DOCUMENTS

| | | |
|---|---|---|
| 2013/0177180 A1 | 7/2013 | Bharatan et al. |
| 2015/0001647 A1* | 1/2015 | Dehe .................... B81B 3/0021 257/416 |
| 2016/0112807 A1* | 4/2016 | Yuan .................... H04R 19/04 381/174 |
| 2016/0192086 A1 | 6/2016 | Barzen et al. |

FOREIGN PATENT DOCUMENTS

| | | |
|---|---|---|
| GB | 2467776 A | 8/2010 |
| WO | 2014193954 A1 | 12/2014 |

* cited by examiner

MEMS DEVICE AND METHOD FOR PRODUCING A MEMS DEVICE

CROSS-REFERENCE TO RELATED APPLICATION

This application claims priority to German Patent Application Serial No. 10 2016 123 130.4, which was filed Nov. 30, 2016, and is incorporated herein by reference in its entirety.

TECHNICAL FIELD

Various embodiments relate generally to a MEMS device and to a method for producing a MEMS device.

BACKGROUND

A MEMS device can be used for example as a microphone or as a loudspeaker. Such a MEMS device can be configured for example with a membrane and either one or two electrodes, which are also referred to as backplate(s) or backplate electrode(s). The membrane can be separated from the electrode or the two electrodes by (respectively) an air gap. Sound is converted into electrical signals by detection of the varying capacitance between the membrane and the electrode or electrodes if the membrane oscillates as a response to sound waves, or vice versa.

In the case of membrane sizes realized hitherto with a diameter in the range of 700 to 900 µm, a sufficient stiffness of the electrode(s) can be ensured by a construction of silicon nitride 140 nm/polysilicon 330 nm/silicon nitride 140 nm. For an increase in the membrane diameter, by means of which an improvement in a signal-to-noise ratio might be achieved, an increase in the stiffness of the electrode(s) might be necessary. The stiffness can substantially be defined by the two nitride layers having high intrinsic tensile stress.

For a further stiffening of the electrode(s), an increase in the layer thicknesses of the individual layers might be considered. This might have the following limitations: by way of example, a scaling of the layer thicknesses particularly of nitride may be possible only to a limited extent. In the case of LPCVD nitride used, a limit of the individual process technology may be reached in a region of a layer thickness of approximately 160 nm. In the case of some other process being employed, a maximum layer thickness of approximately 300 nm may possibly be achievable. An increase in the nitride thicknesses from 140 to 160 nm is considered to be insufficient for the stiffening of the scaled-up electrodes, and depending on, for example, a desired membrane size, a layer thickness of 300 nm can also possibly be insufficient for the stiffening of the scaled-up electrodes.

Even with a significant increase to 920 nm, a scaling of the polysilicon thickness exhibits only a relatively weak effect on the stiffening of the electrode. This can be deduced both on the basis of simulation results (see table below), and as a result of fabricating the system with a higher thickness of the polysilicon (990 nm).

SUMMARY

A MEMS device is provided. The MEMS device includes a membrane, and at least one electrode arranged at a distance from the membrane. The at least one electrode includes a layer stack. The layer stack includes a first insulation layer, a first conductive layer arranged thereabove, a second insulation layer arranged thereabove, a second conductive layer arranged thereabove, and a third insulation layer arranged thereabove.

BRIEF DESCRIPTION OF THE DRAWINGS

In the drawings, similar reference signs usually refer to the same parts in all the different views, wherein, for the sake of clarity, in some instances not all parts corresponding to one another are provided with reference signs in all figures. For differentiation, parts of the same or similar type may be provided with an appended numeral in addition to a common reference sign (for example 100_1 and 100_2 for differentiating two electrodes 100). The drawings are not necessarily intended to represent a true-to-scale rendering, rather the emphasis is on elucidating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "above" used with respect to a deposited material that is formed "above" a side or surface can be used herein with the meaning that the deposited material can be formed "directly thereon", i.e. in direct contact with the indicated side or surface. The word "above" with respect to a deposited material that is formed "above" a side or surface can be used herein with the meaning that the deposited material can be formed "directly on" the indicated side or surface with one or a plurality of additional layers arranged between the indicated side or surface and the deposited material.

As used herein, a "circuit" can be understood to mean any kind of logic implementing unit, which can be a special purpose circuit or processor-executing software stored in a memory, firmware or any combination thereof. Furthermore, a "circuit" can be a hardwired logic circuit or a programmable logic circuit, for example a programmable processor, for example a microprocessor (for example a Complex Instruction Set Computer (CISC) processor or a Reduced Instruction Set Computer (RISC) processor). A "circuit" can also be processor-executing software, for example any kind of computer program, for example a computer program using a virtual machine code, for example Java. All other kinds of implementation of the respective functions which will be described in detail below can also be understood as a "circuit". An interpretation to the effect that any two (or more) of the circuits described can be combined into one circuit is also possible.

Figure 1A:
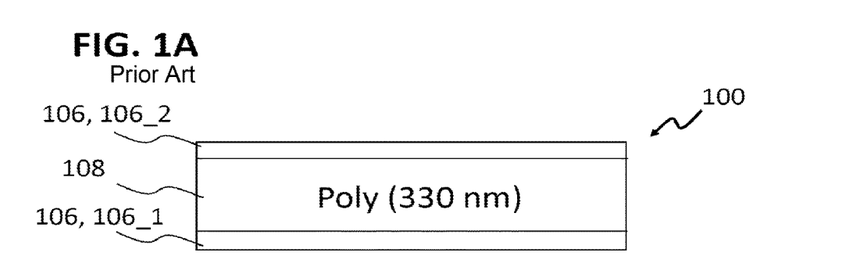
FIG. 1A shows an electrode of a conventional MEMS device.
Figure 2:
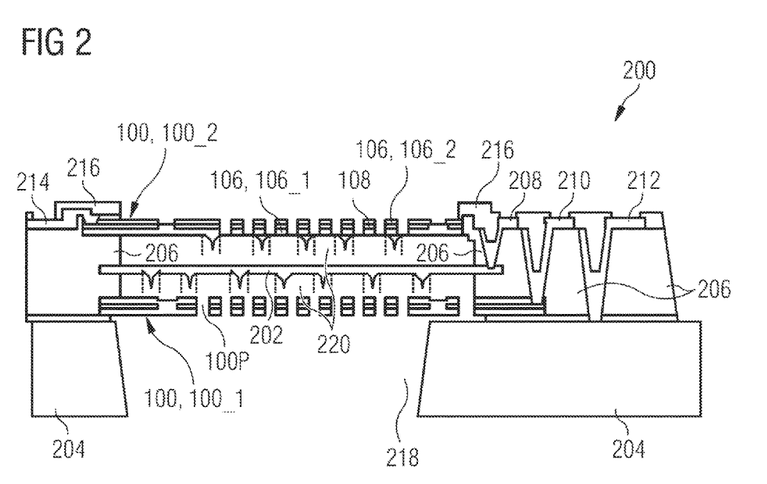
FIG. 2 shows a double-electrode capacitor microphone system.

FIG. 2 shows a conventional microelectrical mechanical system (MEMS) device 200 (which can be e.g. a double-electrode capacitor microphone system) in which at least one electrode 100 such as is shown in FIG. 1A can be used.

The MEMS device 200 may include a first electrode 100_1 and a second electrode 100_2, which can be arranged parallel to one another. The first electrode 100_1 can also be referred to as the bottom electrode, and the second electrode 100_2 can also be referred to as the top electrode, wherein these designations should not be understood as restrictive, but rather serve merely for differentiating the electrodes in FIG. 2 (and possibly further figures).

The MEMS device 200 can furthermore include a membrane 202. The membrane 202 can be arranged between the first electrode 100_1 and the second electrode 100_2, for example parallel or substantially parallel to them.

The membrane 202 can be at least partly moveable. The moveable part of the membrane can be able to move as a reaction to an arriving sound wave. By way of example, the moveable part can be deflected, displaced or deformed.

The membrane 202, the first electrode 100_1 and the second electrode 100_2 may include or consist of an electrically conductive material.

The first electrode 100_1, the second electrode 100_2 and the membrane 202 can be held or supported or carried by a suspension 206. A material of the suspension 206 can be electrically insulating. By way of example, the suspension 206 may include or essentially consist of an oxide.

The suspension 206 can be arranged on a carrier 204, for example a substrate 204, for example can be carried thereby. The carrier 204 can for example include or consist of a semiconductor substrate, for example silicon or any other suitable semiconductor substrate.

The electrodes 100_1, 100_2 may include perforations 100P in order to make it possible for a sound pressure to pass through the electrode 100_1a and to reach the membrane 202 and/or in order that air displaced by the moving membrane can emerge from a region between the membrane 220 and the first electrode and/or the second electrode.

A cavity 218 can be provided, for example in the carrier, in order to enable expansion of the air volume displaced by the membrane 202.

As is illustrated in FIG. 1A and FIG. 2, the first electrode 100_1 and/or the second electrode 100_2 can be constructed in a multilayered fashion. By way of example, the first electrode 100_1 and/or the second electrode 100_2 may include an electrically conductive layer 108, for example a polysilicon layer, which can be provided on both main sides with an insulation layer 106_1 and 106_2, respectively, which can be electrically insulating, for example in each case a silicon nitride layer. In various embodiments, a stiffness of at least one electrode can be increased by the use of a multilayer stack (also referred to as "Multistack Backplate" or as layer stack for short). In this case, the multilayer stack may include more layers than the conventional arrangement of two insulation layers with one conductive layer arranged therebetween. By way of example, the multilayer stack may include at least one additional conductive layer and at least one additional insulation layer.

Generally, the MEMS device 200 may include a so-called dual backplate chip including a system including the two electrodes 100 (also referred to as backplates), which are as stiff as possible, and therebetween the membrane 202, which oscillates in the sound field. Typically, the membrane 202 can consist of polycrystalline silicon (in a conventional device for example having a thickness of 450 nm), and the two electrodes 100 can consist of a layer stack 106_1, 108, 106_2 of silicon nitride 140 nm (in the layer 106_1)/polysilicon 330 nm (in the layer 108)/silicon nitride 140 nm (in the layer 106_2). The two nitride layers 106_1, 106_2 on the top side and underside of the electrode 100 can substantially determine the stiffness of the two electrodes 100_1, 100_2.

The conventional MEMS device in accordance with FIG. 2 and FIG. 1A, which can be used as a microphone, for example, usually has a diameter of the membrane 202 of a maximum of approximately 900 μm. As a result, a signal-to-noise ratio (SNR) of the MEMS device can be limited.

In order to increase the signal-to-noise ratio of a MEMS device (e.g. of a MEMS silicon microphone), in various embodiments, a membrane area and chip area can be significantly increased. By way of example, in a conventional MEMS device, a chip size can be 1.2 mm×1.2 mm and a membrane diameter can be 900 μm, whereas in a MEMS device in accordance with various embodiments the chip can have a chip size of, for example, 1.9 mm×1.9 mm and a membrane diameter of 1600 μm.

Upon scaling up the membrane area, in various embodiments, it is endeavoured to raise the signal-to-noise ratio since the signal can be increased by means of the enlarged membrane area, yet the noise proportion in the case of the enlarged membrane area may not be increased or may be increased only insignificantly, or at least to a lesser extent than the signal. By way of example, in the exemplary MEMS device described, the SNR can be raised from 65 dB(A) to 70 dB(A).

Upon the scaling up of membrane diameter and electrode diameter, in various embodiments, it is endeavoured to maintain the stiffness of the electrodes to the greatest possible extent.

In various embodiments, a method for stiffening the electrodes (backplates) and respectively a MEMS device including stiffened electrodes (backplates) are provided in order thereby to enable the membrane area of MEMS microphones to be scaled up.

Figure 1B:
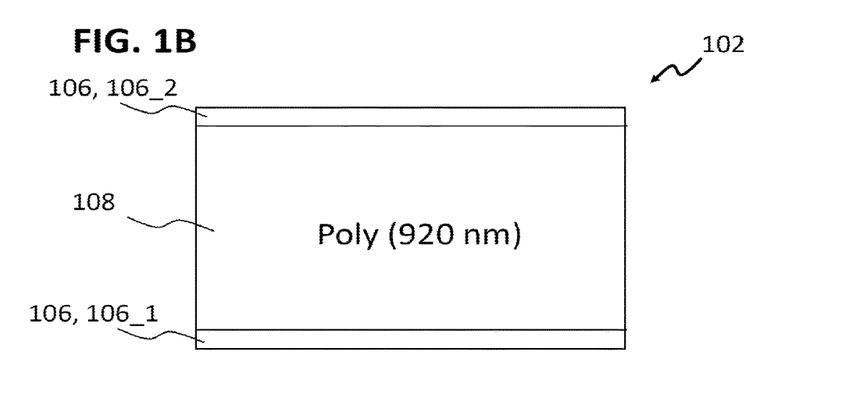
FIG. 1B shows an electrode of a comparative MEMS device.
Figure 1C:
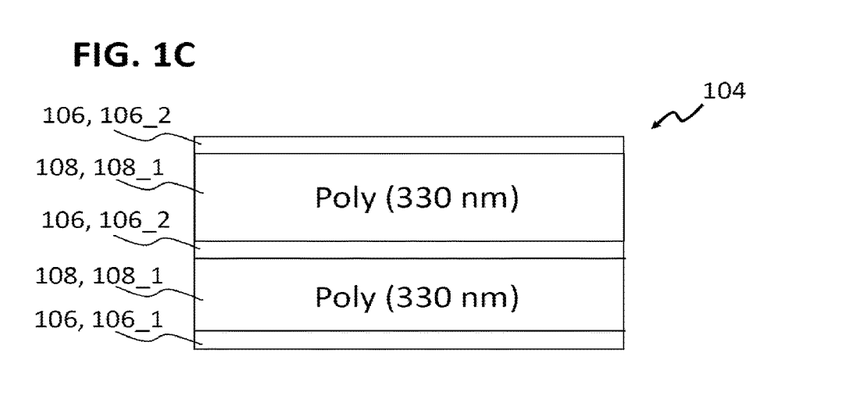
FIG. 1C shows an electrode of a MEMS device in accordance with various embodiments.
Figure 3:
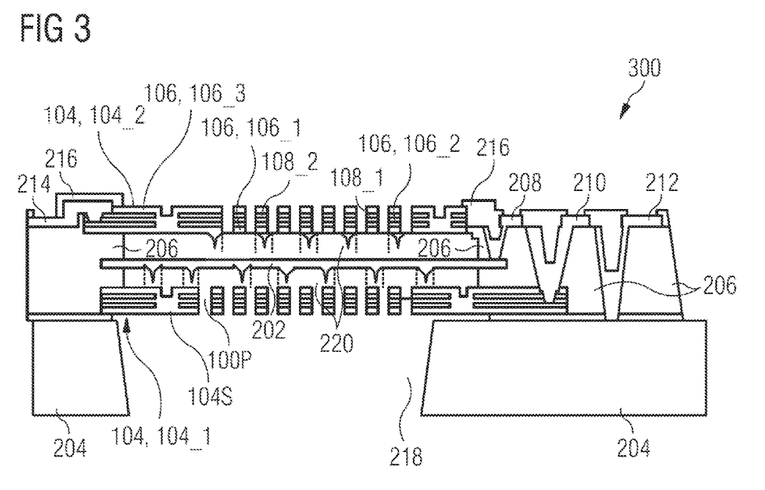
FIG. 3 shows a MEMS device in accordance with various embodiments.

FIG. 1C shows an electrode 104 of a MEMS device in accordance with various embodiments, for example of a MEMS device 300 in accordance with various embodiments such as is illustrated in FIG. 3.

Various embodiments are described on the basis of a MEMS device 300 (a microphone) including two electrodes 104, but the electrode 104 is also applicable to MEMS devices, e.g. microphones, including only one electrode 104 and should accordingly not be understood as restricted to embodiments including two electrodes 104. In the case of a MEMS device including only one electrode 104, in the case of an arrangement corresponding to FIG. 3, for example, only the top electrode 104_2 may be formed, while the bottom electrode 104_1 is omitted.

FIG. 3 shows the MEMS device 300 in accordance with various embodiments, which may be for example a double-electrode capacitor microphone system.

Apart from the described differences (which may concern at least the electrodes, which, in the case of the MEMS device 300, may include additional layers in comparison with the conventional MEMS device 200), the MEMS device 300 may be formed substantially in a manner just like or similar to the MEMS device 200.

Sound pressure waves can have the effect that the membrane 202 vibrates owing to a pressure difference over both areas of the membrane. A size of an air gap between the membrane 202 and (each of) the electrode(s) 104 can change as a result. To put it another way, a distance between the membrane 202 and (each of) the electrode(s) 104 varies.

In various embodiments, the membrane 202 and the electrodes 104 may include electrically conductive materials or the membrane can consist thereof. The electrically conductive material can be polysilicon, for example.

The altered distance between the membrane 202 and the electrode(s) can bring about changes in the capacitances arising from the combination of membrane—bottom electrode and/or the combination of membrane—top electrode. These changes in the capacitances can be converted into an output signal dependent on the movement of the membrane.

In various embodiments, the membrane 202 can be prestressed by means of a prestress relative to the bottom electrode 104_1 and/or relative to the top electrode 104_2. The carrier 204 can be earthed, for example by means of an electrically conductive substrate contact 212.

Each of the electrodes 104, that is to say both the electrode 104_1 and the electrode 104_2, may include a plurality of electrically conductive layers 108 and a plurality of insulation layers 106. The electrode(s) 104 can be formed in each case as a layer stack which, in accordance with various embodiments, includes at least two electrically conductive layers 108 and at least three insulation layers 106, which arranged alternately can form the layer stack. By way of example, two electrically conductive layers 108 can be arranged parallel to one another and the insulation layers can be arranged between said electrically conductive layers and on the respective outer side of each of the conductive layers 108. A sequence of first insulation layer—first conductive layer—second insulation layer—second conductive layer—third insulation layer can thus result.

In various embodiments, each of the electrically conductive layers 108 of the electrode(s) 104 can be contacted by means of an electrically conductive electrode contact 214, 210. Furthermore, the membrane 202 can be electrically conductively contacted, for example by means of an electrically conductive contact 208. This can make it possible to lead away the signal generated by the membrane 202 moving relative to the electrodes 104. By means of the electrically conductive electrode contact 210 and/or 214, in each case the plurality of electrically conductive layers 108_1, 108_2 within an electrode 104_1 and/or 104_2, respectively, can be electrically conductively connected to one another.

In various embodiments, the carrier 204, e.g. the substrate 204, of the MEMS device 300 can be contacted by means of an electrically conductive carrier contact 212.

In various embodiments, the electrode contacts 210, 214 and/or the membrane contact 216 and/or the carrier contact 212 can be electrically insulated from one another by means of an insulator 216.

In addition to a supporting function, i.e. a contribution to the stiffness of the electrode 104, the insulation layers 106 can be used to produce a, for example flat, basic shape of the electrode 104 and/or to insulate the electrically conductive layers 108 of the electrode 104 from an electrically conductive contact with other electrically conductive parts of the MEMS device 300 (e.g. with the membrane 202).

In various embodiments, the insulation layers 106 may include a dielectric material, for example silicon nitride. Each of the insulation layers can have a thickness in a range of approximately 20 nm to approximately 300 nm, for example of approximately 20 nm to approximately 160 nm, for example of approximately 40 nm to approximately 130 nm, e.g. of approximately 60 nm to approximately 100 nm, for example around approximately 80 nm.

In various embodiments, the electrically conductive layers 108 may include a conductive material, for example polysilicon. Each of the electrically conductive layers can have a thickness in a range of approximately 20 nm to approximately 1000 nm, e.g. of approximately 20 nm to approximately 800 nm, for example of approximately 100 nm to approximately 600 nm, e.g. of approximately 200 nm to approximately 400 nm, for example around approximately 300 nm.

In various embodiments, the electrode 104, for example one or both of the electrodes 104_1, 104_2 of the MEMS device 300 (which may include the two electrodes 104_1, 104_2), can have a symmetrical construction. In this case, a symmetry (and correspondingly an asymmetry explained further below) can refer to a central plane of the electrode 104, said central plane running parallel to main areas of electrode, i.e. can refer to a configuration of the electrode 104 that is asymmetrical or symmetrical in relation to said central plane, in the sense of a mirror symmetry for example. In this case, the descriptions explained herein with regard to symmetry refer only to an arrangement and thickness of the layers of the electrode 104 such as become visible in a cross section, for example, and not to some other configuration of the electrode 104, for example a configuration of perforations 100P in the electrode 104, which can be embodied symmetrically or asymmetrically (for example in a manner tapering toward a surface of the electrode) with respect to the central plane, independently of whether the electrode 104 is symmetrical or asymmetrical with regard to its layer construction.

For the symmetrical construction (which is illustrated by way of example in FIG. 3), the first insulation layer 106_1 can have the same (or substantially the same) thickness as the third insulation layer 106_3, and the first conductive layer 108_1 can have the same (or substantially the same) thickness as the second conductive layer 108_2.

Furthermore, in various embodiments, the first electrode 104_1 and the second electrode 104_2 can have the same or substantially the same construction, such that a construction of the MEMS device 300 may thus also be symmetrical in relation to a plane running centrally between the electrodes.

In other embodiments, the first electrode 104_1 and the second electrode 104_2 can have a different construction, such that the construction of the MEMS device 300 may be asymmetrical in relation to the plane running centrally between the electrodes.

In various embodiments, the layer stack of each of the electrodes 104_1, 104_2 may include or essentially consist of five layers, for example three layers of silicon nitride and two layers of polysilicon. The silicon nitride layers 106_1, 106_2, 106_3 can each have a thickness in a range of approximately 20 nm to approximately 300 nm. The polysilicon layers 108_1, 108_2 can each have a thickness in a range of 100 nm to 1000 nm. By way of example, the silicon nitride layers can each have a thickness of approximately or exactly 140 nm, and the polysilicon layers can each have a thickness of approximately or exactly 330 nm.

Thus, a total thickness in a range of approximately 260 nm to approximately 2900 nm can thus result for each of the electrodes 104_1, 104_2. In order to achieve a total thickness which is significantly smaller than it would be if (almost) maximum thicknesses were used for the individual layers, and which is significantly larger than it would be if (almost) minimum thicknesses were used for the individual layers, insulation layers 106_1, 106_2, 106_3 having a relatively large thickness, that is to say for example between 100 nm and 300 nm, can be combined with electrically conductive layers 108_1, 108_2 having a relatively small thickness, that is to say for example between 100 nm and 400 nm. Conversely, insulation layers 106_1, 106_2, 106_3 having a relatively small thickness, that is to say for example between 20 nm and 100 nm, can be combined with electrically conductive layers 108_1, 108_2 having a relatively large thickness, that is to say for example between 400 nm and 1000 nm.

In various embodiments, insulation layers 106_1, 106_2, 106_3 having a relatively large thickness, that is to say for example between 100 nm and 300 nm, can be combined with electrically conductive layers 108_1, 108_2 having a relatively large thickness, that is to say for example between 400 nm and 1000 nm.

In various embodiments, insulation layers 106_1, 106_2, 106_3 having a relatively small thickness, that is to say for example between 20 nm and 100 nm, can be combined with electrically conductive layers 108_1, 108_2 having a relatively small thickness, that is to say for example between 100 nm and 400 nm.

In various embodiments, in the case of the symmetrical construction of the electrode 104, the outer insulation layers 106_1, 106_3 can have an identical thickness, and the central insulation layer 106_2 can have the same thickness as the outer insulation layers 106_1, 106_3.

In various embodiments, in the case of the symmetrical construction of the electrode 104, the outer insulation layers 106_1, 106_3 can have an identical thickness, and the central insulation layer 106_2 can have a thickness different therefrom. By way of example, the central insulation layer 106_2 can be thicker or thinner than the outer insulation layers 106_1, 106_3.

In various embodiments, the electrode 104, for example one or both of the electrodes 104_1, 104_2 of the MEMS device 300 (which may include the two electrodes 104_1, 104_2), can have an asymmetrical construction.

For the asymmetrical construction (not illustrated), in various embodiments, a construction of the electrode 104 (e.g. within the electrode) can be asymmetrical. By way of example, the first insulation layer 106_1 can have a different thickness from the third insulation layer 106_3, and/or the first conductive layer 108_1 can have a different thickness from the second conductive layer 108_2.

Furthermore, in various embodiments, the first electrode 104_1 and the second electrode 104_2 can have the same or substantially the same construction. This can enable a construction of the MEMS device that is mirror-symmetrical in relation to a plane (which can lie for example in or near the membrane 202) running centrally between the electrodes 104, or a translationally symmetrical construction, in which the two electrodes appear substantially like copies of one another shifted via the plane running between the electrodes 104 (as explained above, this consideration of symmetry relates to the arrangement/thickness of the layers in the stack, and not e.g. to an area configuration of the respective individual layers, the diameter or an edge configuration of the electrodes 104, etc.)

In other embodiments, the first electrode 104_1 and the second electrode 104_2 can have a different construction, for example with regard to the thicknesses of the individual layers, the materials used, or the like. This has the effect that the construction of the MEMS device 300 is also asymmetrical.

In the case of an asymmetrical construction of the electrode 104, e.g. of the bottom electrode 104_1 and/or of the top electrode 104_2 or of the single electrode 104, if a MEMS device including only one electrode is involved, in various embodiments, the upper electrically conductive (e.g. polysilicon) layer 106_2 can be formed such that it is thinner than the lower electrically conductive (e.g. polysilicon) layer 106_1.

A process engineering advantage can thus be achieved in various embodiments. This is because in order to make contact with the lower electrically conductive (e.g. polysilicon) layer 106_1, it may be necessary to etch through the upper electrically conductive (e.g. polysilicon) layer 106_2 in addition to the upper insulation layer 106_3 and the central insulation layer 106_2 which may be or have silicon nitride layers, for example. In the case of a thinner configuration of the upper electrically conductive (e.g. polysilicon) layer 106_2, an etching duration can thus be shortened in comparison with a configuration in which the upper electrically conductive (e.g. polysilicon) layer 106_2 is of exactly the same thickness as the lower electrically conductive (e.g. polysilicon) layer 106_1. In addition to shortening the process duration, this can afford the advantage that an electrically conductive (e.g. polysilicon) layer in the membrane contact 208 can also be thinned (undesirably) during this etching. A shorter process time would reduce this undesired effect.

The layer stack of each of the electrodes 104_1, 104_2 may include or essentially consist of five layers, for example three layers of silicon nitride and two layers of polysilicon. The silicon nitride layers 106_1, 106_2, 106_3 can each have a thickness in a range of approximately 20 nm to approximately 300 nm. The polysilicon layers 108_1, 108_2 can each have a thickness in a range of 20 nm to 1000 nm. By way of example, the silicon nitride layers can each have a thickness of approximately or exactly 140 nm, and the polysilicon layers can each have a thickness of approximately or exactly 330 nm. By way of example, the silicon nitride layers can each have a thickness of approximately or exactly 140 nm, one of the polysilicon layers 106, for example the upper polysilicon layer 106_2, can have a thickness of approximately or exactly 50 nm, and the other of the polysilicon layers 106, for example the lower polysilicon layer 106_1, can have a thickness of approximately or exactly 280 nm.

With regard to the total thickness of the electrode 104, the explanations given above with respect to the symmetrically configured electrode can analogously apply to the asymmetrically configured electrode 104.

In various embodiments, the layer stack of the electrode 104 may include more than five layers (not illustrated), for example six, seven, eight, nine or more layers.

Generally, the layer stack in various embodiments may include five layers or more, at least three of which can be insulation layers.

In various embodiments, the layer stack may include an odd number of layers greater than or equal to five, wherein the electrically conductive layers 108 and the insulation layers 106 can be arranged alternately and the insulation layers 106 can be arranged at the exterior, i.e. can form the main surfaces of the electrode 104.

In various embodiments, the layer stack may include an even number of layers greater than five, wherein the electrically conductive layers 108 and the insulation layers 106 can be arranged alternately and one of the insulation layers 106 and one of the electrically conductive layers 108 can be arranged at the exterior, i.e. can form the main surfaces of the electrode 104.

In various embodiments, the electrode 104 including an odd number of more than five layers, that is to say e.g. including seven, nine, eleven, etc., layers, can be configured symmetrically or asymmetrically. In various embodiments, the electrode 104 including an even number of more than five layers, that is to say e.g. including six, eight, ten, etc., layers, can be configured asymmetrically. With regard to further properties of the electrode 104 including the odd or even number of more than five layers, reference is made to the above description concerning the symmetrical or asymmetrical electrode including five layers, which is analogously applicable here, too.

In various embodiments, the electrode 104 may include seven layers, for example four insulation layers 106, e.g. silicon nitride layers, and three electrically conductive layers 108, e.g. polysilicon layers.

In one exemplary construction, each of the insulation layers 106 can be formed as a silicon nitride layer having a thickness of approximately or exactly 120 nm, and each of the electrically conductive layers 108 can be formed as a polysilicon layer having a thickness of approximately or exactly 150 nm. As described above, the electrically conductive layers 108 and the insulation layers 106 can be arranged alternately, wherein two of the insulation layers 106 can form the main surfaces of the electrode 104.

The thicknesses of the individual layers can in various embodiments correspond to the thicknesses described above in association with the asymmetrically formed electrode, wherein forming electrically conductive layers having a thickness of more than 400 nm may possibly be dispensed with if an excessively large total thickness would thus be attained, for example a total thickness of more than 2.5 µm.

In various embodiments, for a symmetry of the electrodes 104 in relation to the plane running centrally between them, the statements made above may be applicable, that is to say that the electrodes can be arranged symmetrically or asymmetrically with respect to the plane in the MEMS device.

In various embodiments, the electrode 104 may include a segmentation 104S (see FIG. 3, in which it is designated). In a region of the segmentation 104S, the electrode 104 can be configured such that it includes only the insulation layers 106, whereas the electrically conductive layers 108 are not formed there or have been removed again, e.g. have been etched. The segmentation can serve for reducing parasitic capacitances. In other embodiments, the electrode 104 can be embodied without segmentation 104S.

Figure 4:
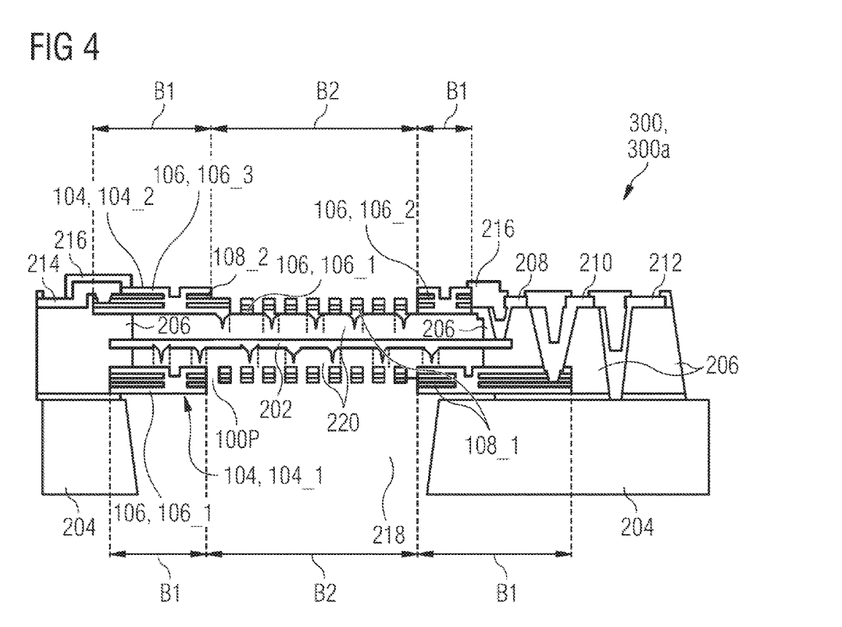
FIG. 4 shows a MEMS device in accordance with various embodiments.

FIG. 4 shows a MEMS device 300a (for example a double-electrode capacitor microphone) in accordance with various embodiments.

The MEMS device 300a can substantially correspond to one of the MEMS devices 300 described above, wherein the MEMS device 300a can differ from the MEMS device 300 to the effect that, in various embodiments, the layer stack including the five or more layers can be structured in the area of the electrode. The electrode 104 may include a first region including five or more layers, which can also be referred to as doubled region B1, and a second region B2, also referred to as thin region B2, which can have fewer layers than the doubled region B1.

In various embodiments, the electrode 104 may include five or more layers only in part of its area (the doubled region B1). By way of example, the doubled region B1 of the electrode 104 may include five or more layers, for example as described in association with the examples above, and the thin region B2 may include fewer than five layers, for example—as illustrated in FIG. 4—three layers, which can be formed for example as described above in association with FIG. 2, or one, two or four layers.

In various embodiments, the electrode 104 may include five or more layers over its entire area, although the electrode 104 may include more layers in the doubled region B1 than in the thin region B2. By way of example the doubled region B1 of the electrode 104 may include six or more layers, for example as described in association with the examples above, and the thin region B2 can be formed with a smaller number of layers than in the doubled region B1. By way of example, the doubled region B1 may include one, two, three or more layers more than the thin region B2, wherein the thin region B2 can also always include at least five layers. By way of example, the electrode 104 may include five layers in the region B2 and six, seven, eight or more layers in the region B1, or the electrode 104 may include six layers in the region B2 and seven, eight, nine or more layers in the region B1.

In various embodiments, the doubled region B1 can be formed as a ring, for example as a ring extending from an outer circumference of the electrode 104 in the direction of a central axis of the electrode 104 (also referred to as edge region). This embodiment is illustrated in FIG. 4.

In various embodiments, the doubled region B1 may include five layers, for example a layer stack including three insulation layers 106 and two electrically conductive layers 108, e.g. in a layer sequence as described above, for example silicon nitride 140 nm/polysilicon 330 nm/silicon nitride 140 nm/polysilicon 330 nm/silicon nitride 140 nm.

A central region of the electrode 104 may include the thin region B2, for example after a structuring. The thin region may include for example a layer sequence including three layers, e.g. silicon nitride 140 nm/polysilicon 330 nm/silicon nitride 140 nm.

In various embodiments, a stiffening can be realized substantially by the ring including five layers in the region of a suspension of the electrode 104, that is to say in a region in which the electrode 104 is held by the suspension. The central region/inner region can be constructed only from three layers and thus be thinner than the stabilizing ring including five layers.

Upon implementation of the stabilizing ring, the electrode 104 can be formed for example as illustrated in FIG. 4.

By way of example, it is possible, as illustrated in the case of the top electrode 104_2, for the two insulation layers 106_1, 106_2 and the electrically conductive layer 106_1 to extend through the entire electrode 104_2 (possibly with the exception of the perforations 100P), that is to say through the doubled region B1 and the thin region B2, whereas the insulation layer 106_1 and the electrically conductive layer 106_2 can be formed only in the doubled region B1. In various embodiments, the insulation layer 106_3 and the electrically conductive layer 106_2 may firstly have been formed over the entire area of the electrode 104_2 and then have been removed in a patterning process, for example by means of etching. In various embodiments, formation of the insulation layer 106_3 and of the electrically conductive layer 106_2 in the region B2 may be/have been prevented, for example by means of masking.

By way of example, it is possible, as illustrated in the case of the bottom electrode 104_1, for the two insulation layers 106_2, 106_3 and the electrically conductive layer 106_2 to extend through the entire electrode 104_1 (possibly with the exception of the perforations 100P), that is to say through the doubled region B1 and the thin region B2, whereas the insulation layer 106_1 and the electrically conductive layer 106_1 can be formed only in the doubled region B1. In various embodiments, the insulation layer 106_1 and the electrically conductive layer 106_1 may firstly have been formed over the entire area of the electrode 104_1 and then have been removed in a patterning process, for example by means of etching. In various embodiments, formation of the insulation layer 106_3 and of the electrically conductive layer 106_1 in the region B2 may be/have been prevented, for example by means of masking.

In various embodiments, the doubled region B1 can be formed as a ring which does not extend from the outer circumference of the electrode 104, but rather is arranged differently in the electrode area, e.g. as a ring whose central axis coincides with the central axis of the electrode, but does not extend as far as the outer circumference of the electrode 104. In that case, the thin region B2 can be arranged at least within the ring in a central region of the electrode 104. In the case where the ring does not extend as far as the outer circumference, the thin region B2 can additionally extend from the outer circumference as far as the ring.

In various embodiments, the doubled region B1 can have a different shape from a ring shape. By way of example, it may include radial struts, a perforated area (wherein both the thin regions B2 and perforations 100P can be arranged for example in the holes of the doubled region), rib-like and/or chequered structures, or any other structuring which may be suitable for increasing the stiffness of the electrode to an extent such that an increase in the area of the membrane 202 beyond the conventionally used size is made possible, without a functionality (e.g. with regard to the SNR) of the MEMS device being impaired owing to an excessively low stiffness of the electrode.

In various embodiments, the doubled region B1 can be removed in the thin regions B2, for example by means of a structuring. The thin regions B2 can be arranged around the perforations 100P, for example. In this case, the thin regions B2 can be formed such that no layer stack including five or more layers is present.

In the region B1, which can be arranged at a predetermined distance from the perforations 100P, the electrode 104 may include for example a five-layered layer stack, e.g. in a layer sequence including silicon nitride 140 nm/polysilicon 330 nm/silicon nitride 140 nm/polysilicon 330 nm/silicon nitride 140 nm.

In regions directly adjoining the perforations 100P, after the structuring the electrode 104 may include for example a three-layered construction, in a layer sequence including e.g. silicon nitride 140 nm/polysilicon 330 nm/silicon nitride 140 nm.

In various embodiments, the stiffening can substantially be realized by the doubled region B1 including five layers at the defined distance around the perforations 100P. The thin region B2 around the perforations 100P can be constructed only from three layers and thus be thinner than the stabilizing regions including five layers. This can afford advantages in a reduction of the noise contribution of the electrode 104.

In various embodiments, that area region of the electrode 104 which does not include the doubled region B1 may include the thin region B2. In various embodiments, the area region of electrode 104 may include the doubled region B1, the thin region B2 and the perforations 100P.

In various embodiments, it is possible for the layers which are absent in the thin region B2 in comparison with the doubled region B1 not to be implemented. In various embodiments, it is possible for the layers which are absent in the thin region B2 in comparison with the doubled region B1 to be removed, for example etched away, after formation.

In various embodiments, a structuring of the electrode such that it includes a doubled region B1 and a thin region B2 can entail a reduction of the noise contribution of the electrode 104.

Figure 5:
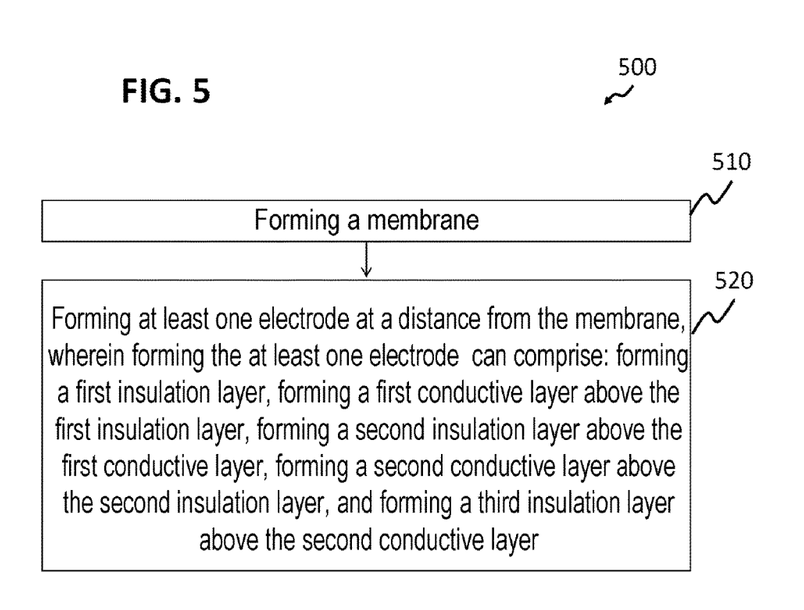
FIG. 5 shows a flow diagram of a method for producing a MEMS device in accordance with various embodiments.

FIG. 5 shows a flow diagram 500 of a method for producing a MEMS device in accordance with various embodiments.

The method may include forming a membrane (at 510), and forming at least one electrode at a distance from the membrane, wherein forming the at least one electrode may include: forming a first insulation layer, forming a first conductive layer above the first insulation layer, forming a second insulation layer above the first conductive layer, forming a second conductive layer above the second insulation layer, and forming a third insulation layer above the second conductive layer (at 520).

Deposition processes mentioned below may include for example a chemical vapour deposition (CVD), which if appropriate may be plasma enhanced (PECVD) or may be for example a low pressure chemical vapour deposition (LPCVD).

In various embodiments, the method for producing a MEMS device may include arranging, e.g. depositing, a lower etch stop layer on a substrate, which may include or be for example a semiconductor substrate, e.g. a silicon wafer. The etch stop layer can provide a reliable delimitation for an etching process. The etch stop layer may include for example an oxide, e.g. a silicon oxide, e.g. tetraethyl orthosilicate (TEOS). A thickness of the etch stop layer can be for example approximately 600 nm.

In various embodiments, the method can furthermore include arranging, e.g. depositing, an insulation layer (hereinafter the insulation layers are formed by way of example as a silicon nitride layer, wherein other insulation layer materials that are typically used in similar MEMS devices can also be used instead of silicon nitride), e.g. a silicon nitride layer, on the lower etch stop layer, and arranging, e.g. depositing, an electrically conductive layer (hereinafter the electrically conductive layers are formed by way of example as a polysilicon layer, wherein other conductive layer materials that are typically used in similar MEMS devices can also be used instead of polysilicon), e.g. a polysilicon layer on the silicon nitride layer, wherein the silicon nitride layer and the polysilicon layer can have thicknesses such as have been described for the respective type of layer in association with FIG. 1C, FIG. 3 and FIG. 4.

In various embodiments, the polysilicon layer can be patterned, for example by means of etching, for example in order to form a segmentation and/or a perforation. In the case of forming a perforation, the silicon nitride layer can furthermore be patterned, for example by means of etching, wherein the perforation can extend as far as the lower etch stop layer.

In various embodiments, the method can furthermore include arranging, e.g. depositing, a further silicon nitride layer, which can be patterned.

The method can furthermore include arranging, e.g. depositing, a further polysilicon layer and arranging, e.g. depositing, a further silicon nitride layer with a respective subsequent patterning, and, if appropriate, further alternating arranging, e.g. depositing, of further polysilicon layers and silicon nitride layers until a desired number of layers of a layer stack of an electrode, as described above for various embodiments, is reached.

In various embodiments, the method can furthermore include filling a substrate surface with a silicon oxide layer, e.g. a TEOS layer, e.g. by means of a deposition method. The silicon oxide layer, e.g. TEOS layer, can be subjected to heat treatment, and, in various embodiments, a surface of the silicon oxide layer, e.g. TEOS layer, can be subjected to chemical mechanical polishing. In various embodiments, a further silicon oxide layer, e.g. TEOS layer, can be deposited and subjected to heat treatment. Cutouts can be formed, for example by means of etching, in the further silicon oxide layer, e.g. TEOS layer, wherein the cutouts can serve for forming anti-adhesion projections (at a membrane yet to be formed) that are intended to prevent a membrane from adhering to the electrode.

In various embodiments, the method can furthermore include arranging, e.g. depositing, a membrane layer, e.g. a polysilicon layer, on the silicon oxide layer, e.g. TEOS layer, wherein the membrane layer can fill the cutouts in such a way that the membrane also forms the anti-adhesion projections. The membrane can have for example a thickness in a range of approximately 100 nm to approximately 550 nm, e.g. of approximately 150 nm to approximately 500 nm, e.g. of approximately 330 nm.

In various embodiments, the method can furthermore include arranging a silicon oxide layer, e.g. a TEOS layer, e.g. by means of a deposition method, on the membrane layer and on the silicon oxide layer, e.g. TEOS layer, arranged below and/or alongside the membrane layer. After the deposition, cutouts can be formed, for example by means of etching, in the silicon oxide layer, e.g. TEOS layer, wherein the cutouts can serve for forming anti-adhesion projections (this time in a top electrode yet to be formed) that are intended to prevent the membrane from adhering to the electrode.

In various embodiments, the method can furthermore include arranging, e.g. depositing, a further insulation layer, e.g. a silicon nitride layer, wherein the insulation layer can be deposited such that it fills the cutouts, such that the insulation layer forms the anti-adhesion projections. In various embodiments, the insulation layer can be patterned, e.g. by means of etching.

In various embodiments, the method can furthermore include arranging, e.g. depositing, a further electrically conductive layer. In various embodiments, the electrically conductive layer can be patterned, e.g. by means of etching.

The method can furthermore include alternately arranging, e.g. depositing, insulation layers and electrically conductive layers until the desired number of layers of the layer stack, as described above in association with FIG. 1C, FIG. 3 and FIG. 4 is reached, wherein the layer stack may include at least three insulation layers and at least two electrically conductive layers.

In various embodiments, instead of patterning the respective individual electrode layers (i.e. the associated insulation layers and electrically conductive layers), it is possible for the entire layer stack to be patterned, e.g. in order to form the perforation(s), wherein the openings formed can extend as far as the silicon oxide layer (e.g. as far as the TEOS layer).

A further silicon oxide layer, e.g. TEOS layer, can be arranged, e.g. deposited, above the topmost electrode layer, e.g. above a topmost silicon nitride layer. The silicon oxide layer, e.g. TEOS layer, can have for example a thickness of approximately 100 nm.

In various embodiments, a contact opening can thereupon be formed, e.g. by means of photolithography, wherein the contact opening can extend through the silicon nitride layers and the silicon oxide layer, e.g. TEOS layer, as far as a bottommost polysilicon layer of the layer stack including insulation layers and electrically conductive layers, which layer stack is intended to form an electrode after completion of the MEMS device.

Furthermore, further contact openings can be formed in a manner similar to the contact opening described, wherein one of the contact openings extends through the layers arranged above the membrane as far as the membrane layer, one of the contact openings extends through the layers arranged above the substrate as far as the substrate, and another of the contact openings extends through the layers arranged above the lower electrically conductive layer of the other electrode as far as the lower electrically conductive layer of the other electrode.

In various embodiments, the contact openings can thereupon be filled with electrically conductive material, e.g. titanium, platinum or gold or any other suitable material having a high electrical conductivity. Contacts to the substrate, to the bottom electrode, to the membrane and to the top electrode can thus be formed. Each of the contacts can for example be electrically conductively connected to a surface contact.

In various embodiments, an opening can thereupon be arranged in a rear side of the substrate facing away from the arranged layers. In this case, the lower etch stop layer can serve as a barrier for the etching process in order to prevent an etchant from reaching the bottom electrode.

In various embodiments, the silicon oxide layers, e.g. TEOS layers, can thereupon be removed, such that moveable parts of the MEMS device can be exposed. For this purpose, a protective mask can be arranged on a front side facing away from the rear side.

Some of the embodiments are described in association with devices, and some of the embodiments are described in association with methods. Further advantageous configurations of the method are evident from the description of the device, and vice versa.

In various embodiments, the stiffness of the electrode(s) can be significantly increased by incorporating a plurality of (e.g. more than two) nitride layers. In various embodiments, a sum of thicknesses of the nitride layers (or generally insulation layers, wherein the insulation layers can have a comparatively high intrinsic tensile stress) can be increased in relation to a sum of thicknesses of (two) nitride layers of a conventional electrode, without increasing the thickness of an individual nitride layer in the process (e.g. increasing it beyond a maximum possible/expedient thickness from a technical standpoint). By way of example, the sum of the thicknesses of the more than two insulation layers (nitride layers) can be greater than 320 nm.

In various embodiments, the layer stack may include silicon nitride (e.g. having a thickness of 140 nm)/polysilicon (e.g. having a thickness of 330 nm)/silicon nitride (e.g. having a thickness of 140 nm)/polysilicon (e.g. having a thickness of 330 nm)/silicon nitride (e.g. having a thickness of 140 nm). If the MEMS device includes two electrodes, also referred to as double electrode or as double backplate, this construction in various embodiments can be realized for both electrodes. In various embodiments, different configurations of the construction can be used for the two electrodes.

It can be shown in simulations that a transition to a multiple stack makes it possible to significantly increase the stiffness of the electrode, for example more than in the case where the individual layer thicknesses are increased whilst maintaining the customary construction of the electrode including silicon nitride/poly-si/silicon nitride. In this case, a compliance can be used as an assessment variable as a measure of the stiffness of the electrode(s). This is illustrated in the table below, which compares simulation results concerning the electrode stiffness in the case of a multilayer stack with a standard construction and with a construction having an increased individual layer thickness:

| Electrode variant | Reference (Standard electrode $Si_3N_4$/ polysilicon/ $Si_3N_4$) (see FIG. 1A) | Increased polysilicon thickness ($Si_3N_4$/ Polysilicon/ $Si_3N_4$) (see FIG. 1B) | Multilayer electrode (3 layers $Si_3N_4$, 2 layers polysilicon) (see FIG. 1C) |
|---|---|---|---|
| Compliance of top electrode [nm/Pa] | 2.54 | 1.86 | 1.63 |
| Compliance of bottom electrode [nm/Pa] | 2.55 | 1.85 | 1.63 |

In various embodiments, with the use of the multilayer stack, it is possible to realize a necessary stiffness with a relatively small total layer thickness of the electrode(s). This can be provided to the effect that a noise contribution of the electrode can be minimized and a signal-to-noise ratio can accordingly be optimized.

In various embodiments, a stiffness of the electrode can be increased by use of a multilayer stack.

In various embodiments, a stiffness of the electrode can be significantly increased by incorporation of a plurality of nitride layers. This may be possible with a comparatively (e.g. compared with a total thickness of an electrode 102 in which the individual layers are configured with a thickness such that a stiffness value at least approximately similar to that of the electrode 104 is achieved, which after all is still not achieved even with a polysilicon thickness of 920 nm) small total thickness of the electrode, which can entail advantages in terms of the noise behaviour (a reduction of a noise contribution of the electrode(s)).

In various embodiments, the multilayer stack may include five layers, for example three layers of nitride, e.g. silicon nitride, and two layers of polysilicon. In this case, the nitride and the polysilicon can be arranged alternately one above another, e.g. one on top of another, e.g. silicon nitride 140 nm/polysilicon 330 nm/silicon nitride 140 nm/polysilicon 330 nm/silicon nitride 140 nm (see e.g. FIG. 1C and FIG. 3). By contrast, in the case of a conventional electrode, by way of example, a system including three layers can be used, e.g. silicon nitride 140 nm/polysilicon 330 nm/silicon nitride 140 nm (see e.g. FIG. 1A and FIG. 2).

In various embodiments, the multilayer stack may include more than five layers.

In various embodiments, the insulation material can be a dielectric material.

In various embodiments, an electrical conductivity of the insulation material can be similar to that of silicon nitride.

In various embodiments, the insulation material may include a different material from silicon nitride, for example a material having high intrinsic tensile stress, for example having an intrinsic tensile stress similar to that of silicon nitride.

In various embodiments, the electrically conductive material may include a different material from polysilicon.

In various embodiments, a MEMS device is provided. The MEMS device may include: a membrane and at least one electrode arranged at a distance from the membrane, wherein the at least one electrode may include a layer stack, the layer stack including: a first insulation layer, a first conductive layer arranged thereabove, a second insulation layer arranged thereabove, a second conductive layer arranged thereabove, and a third insulation layer arranged thereabove.

In various embodiments, the membrane can have a diameter of more than 900 μm.

In various embodiments, the first insulation layer, the second insulation layer and/or the third insulation layer may include or essentially consist of silicon nitride.

In various embodiments, the first conductive layer and/or the second conductive layer may include polysilicon.

In various embodiments, the first insulation layer, the second insulation layer and/or the third insulation layer can have a thickness in a range of 20 nm to 300 nm.

In various embodiments, a thickness of the first conductive layer can be greater than a thickness of the second conductive layer.

In various embodiments, a thickness of the first conductive layer can be equal to a thickness of the second conductive layer.

In various embodiments, the second conductive layer can be nearer to the membrane than the first conductive layer.

The MEMS device can furthermore include an electrical contact, which electrically conductively connects the first conductive layer and the second conductive layer to one another.

In various embodiments, the electrical contact can extend from a surface of the layer stack through one of the conductive layers to the other of the conductive layers.

In various embodiments, the layer stack can have a thickness in a range of 100 nm to 2.9 μm.

In various embodiments, the at least one electrode may include a first electrode on a first side of the membrane and a second electrode on a second side of the membrane, said second side being situated opposite the first side.

In various embodiments, the at least one electrode may include a first region, which includes the layer stack, and a second region, in or through which extends at least one of the layers of the layer stack, but not all the layers of the layer stack.

In various embodiments, the first region may include or consist of an edge region of the electrode, and the second region may include or consist of a central region of the electrode.

In various embodiments, the MEMS device can furthermore include a suspension, wherein the membrane and the at least one electrode are held by the suspension, e.g. are suspended therefrom.

In various embodiments, the suspension may include an opening, wherein the membrane and the at least one electrode are connected by their respective edge region to the suspension and are exposed with their respective central region in the central opening of the suspension.

In various embodiments, the at least one electrode may include at least one perforation.

In various embodiments, the MEMS device can furthermore include at least one further electrically conductive layer arranged above the third insulation layer.

In various embodiments, the MEMS device can furthermore include at least one further insulation layer arranged above the further electrically conductive layer.

In various embodiments, a sum of thicknesses of the insulation layers can be greater than 320 nm.

In various embodiments, a method for producing a MEMS device is provided, the method including forming a membrane and forming at least one electrode at a distance from the membrane, wherein forming the at least one electrode may include: forming a first insulation layer, forming a first conductive layer above the first insulation layer, forming a second insulation layer above the first conductive layer, forming a second conductive layer above the second insulation layer, and forming a third insulation layer above the second conductive layer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A MEMS device, comprising:
a membrane; and
at least one electrode arranged at a distance from the membrane,
wherein the at least one electrode comprises a layer stack, the layer stack comprising:
a first insulation layer;
a first conductive layer arranged thereabove;
a second insulation layer arranged thereabove;
a second conductive layer arranged thereabove; and
a third insulation layer arranged thereabove,
wherein the at least one electrode comprises a first electrode on a first side of the membrane and a second electrode on a second side of the membrane, said second side being situated opposite the first side.

2. The MEMS device of claim 1,
wherein the membrane has a diameter of more than 900 μm.

3. The MEMS device of claim 1,
wherein the first insulation layer, at least one of the second insulation layer or the third insulation layer comprises or essentially consists of silicon nitride.

4. The MEMS device of claim 1,
wherein at least one of the first conductive layer or the second conductive layer comprises polysilicon.

5. The MEMS device of claim 1,
wherein at least one of the first insulation layer or the second insulation layer or the third insulation layer has a thickness in a range of 20 nm to 300 nm.

6. The MEMS device of claim 1,
wherein at least one of the first conductive layer or the second conductive layer has a thickness in a range of 20 nm to 1000 nm.

7. The MEMS device of claim 1,
wherein a thickness of the first conductive layer is greater than a thickness of the second conductive layer.

8. The MEMS device of claim 7,
wherein the at least one electrode comprises a bottom electrode arranged below the membrane and wherein the second conductive layer of the bottom electrode is nearer to the membrane than the first conductive layer.

9. The MEMS device of claim 7,
wherein the at least one electrode comprises a top electrode arranged above the membrane and wherein the first conductive layer of the top electrode is nearer to the membrane than the second conductive layer.

10. The MEMS device of claim 1,
wherein a thickness of the first conductive layer is equal to a thickness of the second conductive layer.

11. The MEMS device of claim 1, further comprising:
an electrical contact, which electrically conductively connects the first conductive layer and the second conductive layer to one another.

12. The MEMS device of claim 11,
wherein the electrical contact extends from a surface of the layer stack through one of the conductive layers to the other of the conductive layers.

13. The MEMS device of claim 1,
wherein the layer stack has a thickness in a range of 100 nm to 2.9 μm.

14. The MEMS device of claim 1,
wherein the at least one electrode comprises a first region, which comprises the layer stack, and a second region, into or through which extends at least one of the layers of the layer stack, but not all the layers of the layer stack.

15. The MEMS device of claim 14,
wherein the first region comprises or essentially consists of an edge region of the electrode, and the second region comprises or essentially consists of a central region of the electrode.

16. The MEMS device of claim 1,
wherein the at least one electrode comprises at least one perforation.

17. The MEMS device of claim 1,
wherein a sum of thicknesses of the insulation layers is greater than 320 nm.

18. A method for producing a MEMS device, the method comprising:
forming a membrane; and
forming at least one electrode at a distance from the membrane, forming the at least one electrode comprising:
forming a first insulation layer;
forming a first conductive layer above the first insulation layer;
forming a second insulation layer above the first conductive layer;
forming a second conductive layer above the second insulation layer; and
forming a third insulation layer above the second conductive layer;
wherein the at least one electrode comprises a first electrode on a first side of the membrane and a second electrode on a second side of the membrane, said second side being situated opposite the first side.

19. A MEMS device, comprising:
a membrane; and
at least one electrode arranged at a distance from the membrane,
wherein the at least one electrode comprises a layer stack, the layer stack comprising:
a first insulation layer;
a first conductive layer arranged thereabove;
a second insulation layer arranged thereabove;
a second conductive layer arranged thereabove; and
a third insulation layer arranged thereabove;
a suspension, wherein the membrane and the at least one electrode are held by the suspension, and wherein the suspension comprises an opening, wherein the membrane and the at least one electrode are connected by their respective edge region to the suspension and are exposed with their respective central region in the opening of the suspension.

20. A MEMS device, comprising:
a membrane; and
at least one electrode arranged at a distance from the membrane,
wherein the at least one electrode comprises a layer stack, the layer stack comprising:
a first insulation layer;
a first conductive layer arranged thereabove;
a second insulation layer arranged thereabove;
a second conductive layer arranged thereabove; and
a third insulation layer arranged thereabove;
at least one further electrically conductive layer arranged above the third insulation layer.

21. The MEMS device of claim 20
at least one further insulation layer arranged above the further electrically conductive layer.

* * * * *